United States Patent
Miyazaki et al.

(10) Patent No.: US 6,669,810 B1
(45) Date of Patent: Dec. 30, 2003

(54) METHOD FOR DETECTING ETCHING ENDPOINT, AND ETCHING APPARATUS AND ETCHING SYSTEM USING THE METHOD THEREOF

(75) Inventors: Toshiya Miyazaki, Osaka (JP); Toshihiro Hayami, Osaka (JP); Tadao Nakatsuka, Osaka (JP); Hiroyuki Tanaka, Osaka (JP); Toshiyuki Nakamura, Osaka (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 962 days.

(21) Appl. No.: 09/172,289

(22) Filed: Oct. 14, 1998

Related U.S. Application Data

(62) Division of application No. 08/729,717, filed on Oct. 7, 1996, now Pat. No. 5,885,472, which is a division of application No. 08/568,371, filed on Dec. 6, 1995, now Pat. No. 5,626,714.

(30) Foreign Application Priority Data

Dec. 8, 1994 (JP) .............................................. 6-305193
Nov. 24, 1995 (JP) .............................................. 7-306152

(51) Int. Cl.$^7$ ................................................. C23F 1/00
(52) U.S. Cl. ............................ 156/345.25; 156/345.25; 118/712; 204/298.32
(58) Field of Search ..................... 156/345.25; 118/712; 204/298.32

(56) References Cited

U.S. PATENT DOCUMENTS

| | | | | |
|---|---|---|---|---|
| 4,936,967 A | * | 6/1990 | Ikuhara et al. | 204/192.33 |
| 5,118,378 A | * | 6/1992 | Moroi et al. | 156/345 |
| 5,236,556 A | * | 8/1993 | Yokota et al. | 204/192.33 |
| 5,290,383 A | | 3/1994 | Koshimizu | |
| 5,322,590 A | * | 6/1994 | Koshimizu | 156/626 |
| 5,352,902 A | * | 10/1994 | Aoki | 250/275 |
| 5,565,114 A | * | 10/1996 | Saito et al. | 216/60 |
| 5,626,714 A | | 5/1997 | Miyazaki et al. | |
| 5,759,424 A | * | 6/1998 | Imatake et al. | 216/60 |
| 5,786,886 A | * | 7/1998 | Litvak et al. | 356/72 |

FOREIGN PATENT DOCUMENTS

| | | |
|---|---|---|
| JP | 61-264728 | 11/1986 |
| JP | 62-95829 | 5/1987 |
| JP | 62-16920 | 7/1987 |
| JP | 62-159431 | 7/1987 |
| JP | 2-94629 | 4/1990 |
| JP | 3-14229 | 1/1991 |

* cited by examiner

Primary Examiner—Gregory Mills
Assistant Examiner—Luz Alejandro
(74) Attorney, Agent, or Firm—Burns, Doane, Swecker & Mathis, LLP

(57) ABSTRACT

A method for detecting an etching endpoint and a plasma etching apparatus and a plasma etching system using such a device are disclosed, in which time series data of a signal corresponding to the amount of light of the plasma light generated during the plasma etching process are arithmetically processed, so that the change of light amount is corrected and an etching endpoint is detected from the time series data after the correction.

5 Claims, 19 Drawing Sheets

METHOD FOR DETECTING ETCHING ENDPOINT, AND ETCHING APPARATUS AND ETCHING SYSTEM USING THE METHOD THEREOF

This application is a divisional, of application Ser. No. 08/729,717, filed Oct. 7, 1996, which is a divisional of application Ser. No. 08/568,371, filed Dec. 6, 1995.

BACKGROUND OF THE INVENTION

1. Field of the Invention

The present invention relates to a method for detecting an etching endpoint in a plasma etching process, and an etching apparatus and an etching system using such a method.

2. Description of Related Art

FIG. 1 is a block diagram and a model diagram showing the configuration of a conventional etching apparatus. In FIG. 1, numeral 1 designates a vacuum processing chamber, in which an upper electrode 2a and a lower electrode 2b are arranged in opposed relation to each other. The side wail of the vacuum processing chamber 1 has a detection window 4, outside of which an actinometer 21 and an endpoint detector 22 are arranged.

The lower electrode 2b has a semiconductor substrate 3 arranged thereon. A predetermined process gas is introduced into the vacuum processing chamber 1, and a high-frequency voltage is applied between the upper electrode 2a and the lower electrode 2b from a high-frequency power source 8 thereby to subject the semiconductor substrate 3 to plasma etching.

In fabricating a semiconductor device, it is important to etch exactly a predetermined amount. Unless the amount of etching is proper, such problems as an increase in the number of defective products may be imposed. In view of this, an etching endpoint is detected by the endpoint detector 22 for finishing the etching process. An etching endpoint is conventionally detected in the following manner. The plasma light generated due to reaction products during the plasma etching process is reduced by removal of the object etched. The change in amount of light is measured by the actinometer 21 through the detection window 4, and an etching endpoint is detected by the endpoint detector 22.

However, the detection window 4 faced the inside of the vacuum processing chamber 1, and is exposed all the time to the reaction products generated during the etching process. Hence, with the lapse of time, reaction products are progressively deposited on the detection window 4. Then the amount of light received by the actinometer 21 outside of the detection window 4 is reduced by an amount more than what would otherwise be reduced by an etching process alone. The result is variations of the signal intensity outputted from the actinometer 21, leading to a displacement of the etching endpoint detected, or making the detection impossible. It is therefore necessary to correct the output signal of the actinometer 21 by gain adjustment of the signal intensity or the like means.

Japanese Patent Application Laid-Open No.3-14229 (1991) discloses an endpoint detection apparatus comprising an automatic bias regulator for accumulating the applied time of high-frequency power and automatically regulating the bias of an actinometer in accordance with the accumulated time. Also, Japanese Patent Application Laid-Open No.62-165920(1987) describes an etching endpoint judging apparatus comprising a sensitivity regulation circuit for regulating to a set value the amount of light reduced due to the clouding of the detection window.

In the former apparatus, it is difficult to attain correspondence between the accumulated time and the automatic bias regulation in a manner to satisfy the types of the process gas, the object to be etched and the apparatus. The latter disclosure, on the other hand, poses the problem of requiring a sensitivity regulation circuit to be separately provided.

Further, an apparatus is conceivable having such a function that the original waveform obtained by plotting the output signal of the actinometer 21 is corrected by primary differentiation and secondary differentiation. Mere differentiation, however, develops conspicuous fluctuations of the original waveform and reduces the detection accuracy of an etching endpoint.

Furthermore, in cases where an amount of the deposited reaction products on the detection window is large and where an exposed area of an object (wafer) to be etched is small, an etching process undergoes only a slight change in the amount of light between the initial and final periods thereof. When the change is slight, detection of an endpoint is very difficult and the signal is required to be amplified.

SUMMARY OF THE INVENTION

The invention has been developed for solving the above-mentioned problems, and an object thereof is to provide a method for accurately detecting an etching endpoint and an etching apparatus and an etching system using such a method, in which an original waveform obtained by plotting data corresponding to the amount of light is converted by a predetermined arithmetic operation.

In a method for etching endpoint detection and an etching apparatus and an etching system according to the invention, the plasma light generated during the plasma etching process is received through a detection window to obtain time series data of the signal corresponding to the amount of received light, and the time series data is arithmetically processed to correct the changes in the amount of received light, so that an etching endpoint is detected from the corrected time series data. It is thus not necessary to provide any separate circuit, unlike in the conventional methods and apparatuses.

Also, the average value of the original time series data for a predetermined period is calculated, and a coefficient for corrective computation is obtained using the average value in advance. The time series data is corrected by the coefficient. The gain can thus be corrected automatically.

Further, the initial value of the time series data is reduced to zero (offset) while correcting the change in light amount at the sane time, and the offset time series data is multiplied by a predetermined value. Even in the case where a difference between the initial and final values (changes in light amount) is small, for example, the amount of the deposited reaction products on the detection window is considerable, or an exposed area on a object to be etched is small, therefore, an etching endpoint can be detected accurately. Also, the fluctuations of the original time series data are not obscured, since only the difference between initial and final values is amplified.

Furthermore, a reference value for a predetermined period when the amount of light is settled during the etching process is set, and the time series data for the predetermined period is corrected according to the reference value. Consequently, an etching endpoint is not erroneously detected.

In addition, the time series data is corrected by a function for maintaining the ratio between values determined at a predetermined time interval. In this case, too, an etching endpoint can be detected without being affected by the amount of the deposited reaction products and the size of the exposed area.

The above and further objects and features of the invention will more fully be apparent from the following detailed description with accompanying drawings.

DESCRIPTION OF THE PREFERRED EMBODIMENTS

Now, the present invention will be described below with reference to the drawings showing exemplary embodiments.

Figure 1:
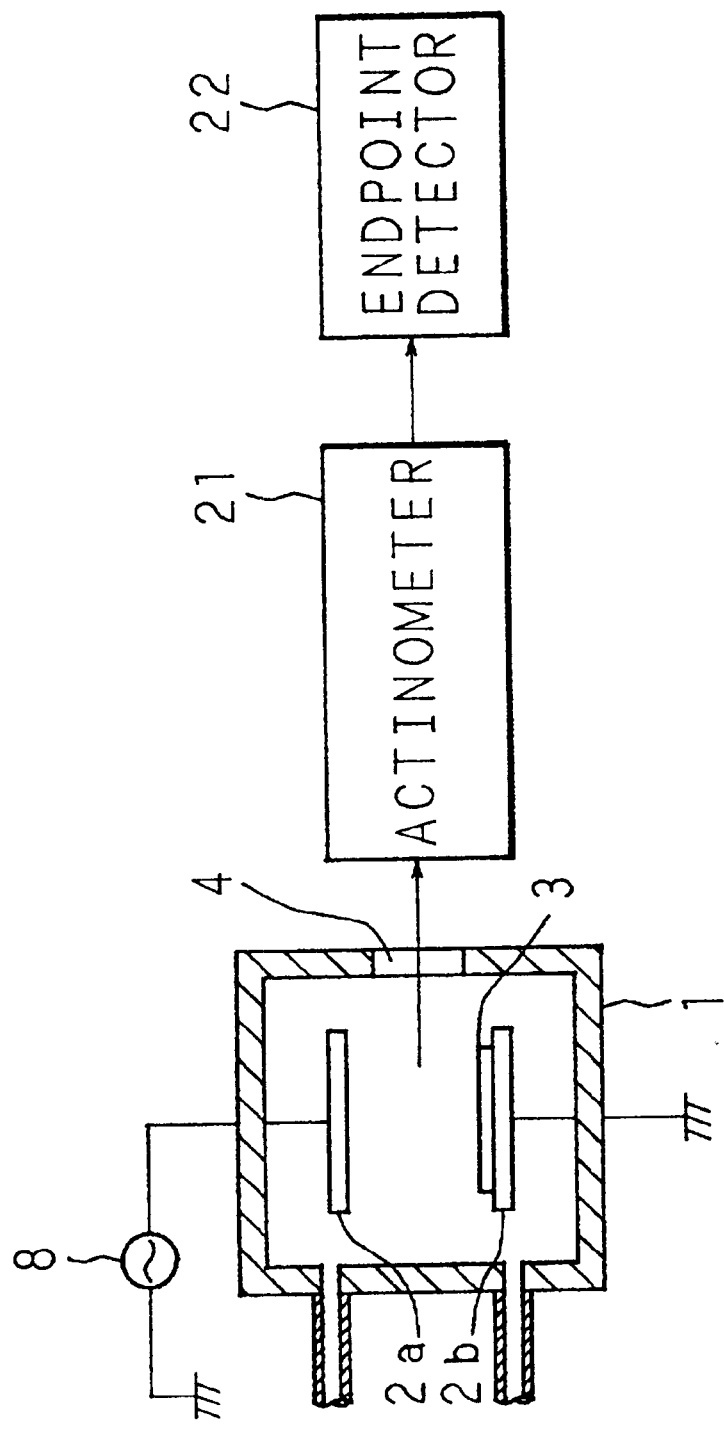
FIG. 1 is a diagram showing a block configuration with a model of a conventional etching apparatus.
Figure 2:
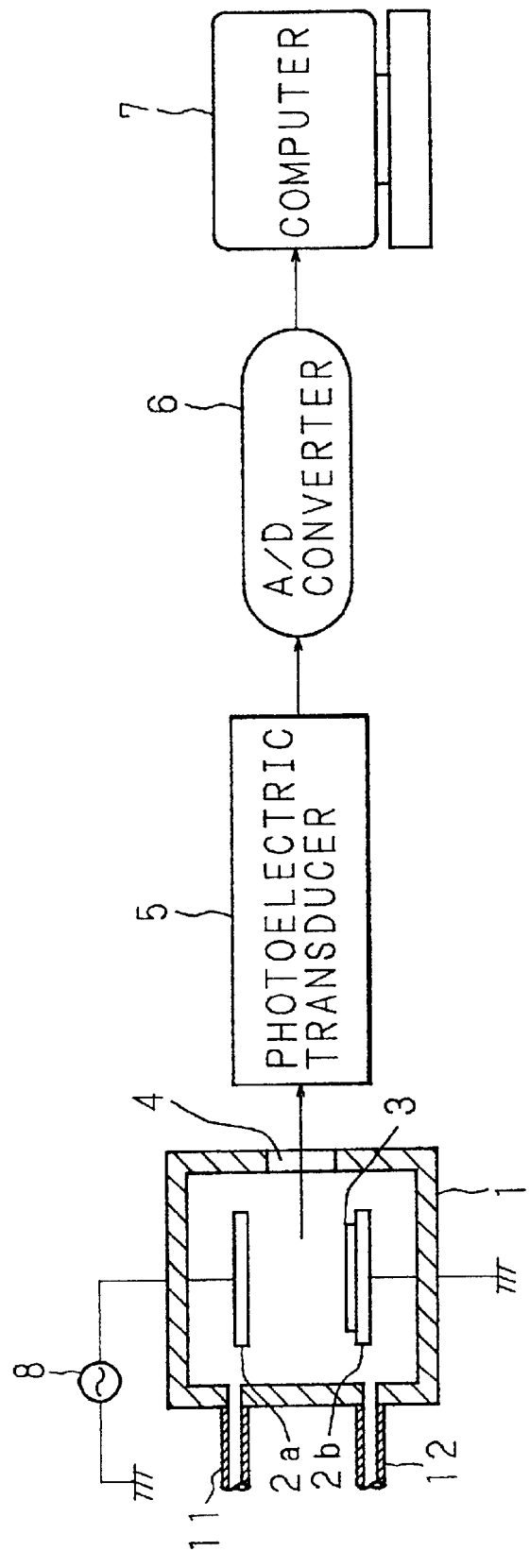
FIG. 2 is a model diagram showing the configuration of an etching apparatus according to the invention.

FIG. 2 is a diagram showing a block configuration and an example of an etching apparatus according to the invention. In FIG. 2, numeral 1 designates a vacuum processing chamber which is connected with an inlet pipe 11 for introducing the process gas and an exhaust pipe 12. The vacuum processing chamber 1 also has arranged therein an upper electrode 2a and a lower electrode 2b in opposed relation to each other. The upper electrode 2a is connected to a high-frequency power source 8, while the lower electrode 2b is grounded.

A detection window 4 is formed in the side wall of the vacuum processing chamber 1. The detection window 4 has on the outside thereof a photoelectric transducer 5, an A/D converter 6 and a computer 7 for detecting an etching endpoint on the basis of the amount of light changing with time. The photoelectric transducer 5 (photodiode, monochrometer, etc.) is for converting the plasma light of only a redetermined wavelength which passes through the detection window 4 into an electrical signal in accordance with the amount of light thereof. The A/D converter 6 converts the analog electrical signal obtained by the photoelectric transducer 5 into a digital signal. The computer 7 is adapted to detect an etching endpoint according to the digital signal. In other words, various arithmetic operations are performed on the basis of a predetermined program for executing processes, such as a process to take in the digital signal outputted from the A/D converter 6, a process to correct a time series data, and a process to detect an etching endpoint.

A semiconductor substrate 3 is disposed on the lower electrode 2b in the vacuum processing chamber 1 that has been exhausted by way of the exhaust pipe 12, and a predetermined process gas is introduced into the vacuum processing chamber 1 through the inlet pipe 11. A high-frequency power is applied between the upper electrode 2a and the lower electrode 2b by the high-frequency power source 8, thereby etching the semiconductor substrate 3 by the generated plasma. The plasma light generated during the etching process is passed through the detection window 4 and hence the passed light is photoelectrically converted into analog signals by the photoelectric transducer 5. The signals are converted into digital data by the A/D converter 6. The data obtained from the A/D converter 6 is used by the computer 7 to perform the arithmetic operation thereby to detect an etching endpoint.

Now, the arithmetic operation performed by the computer 7 will be described in detail.

(Example 1)

Figure 3:
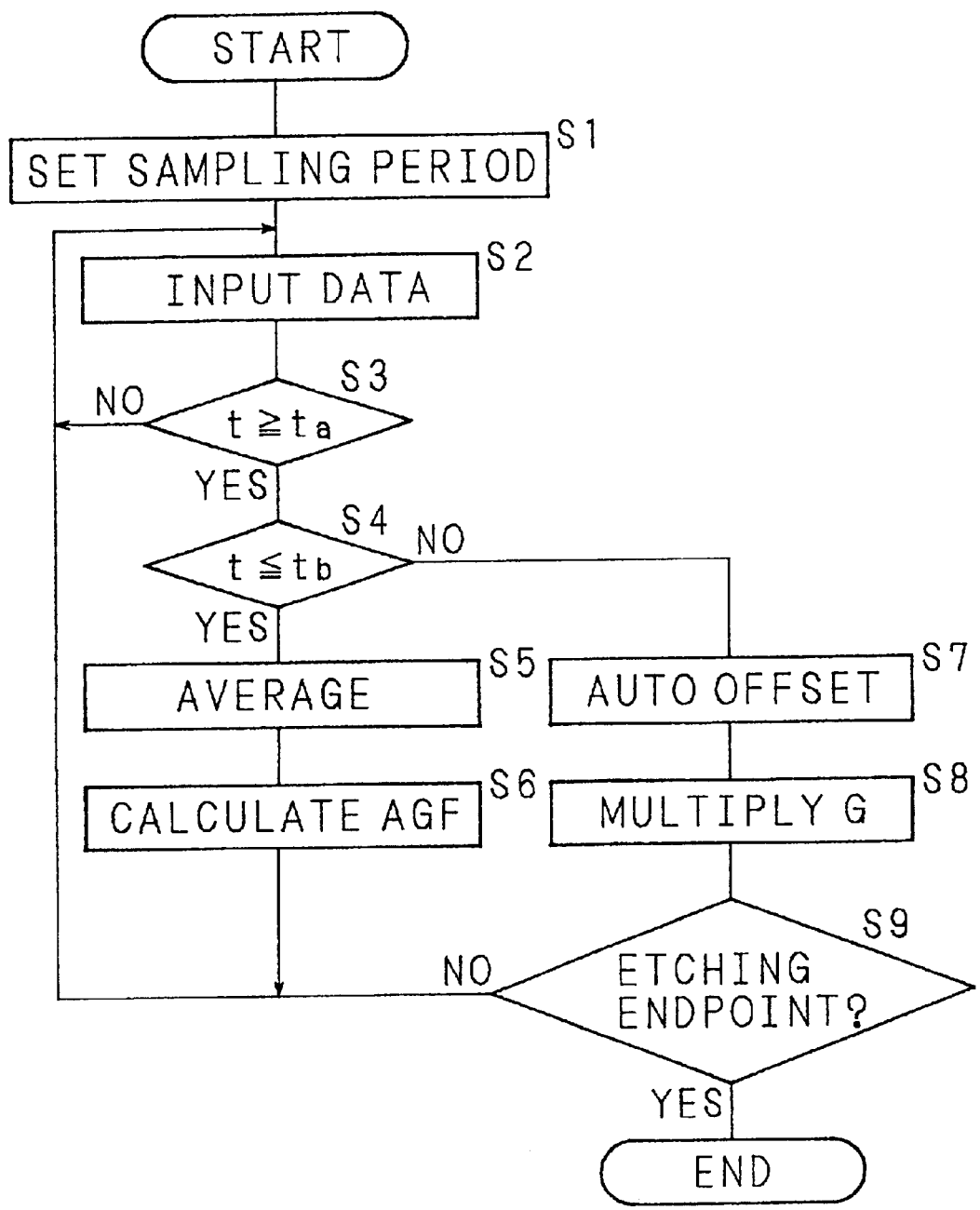
FIG. 3 is a flowchart showing the procedure of operation according to example 1.
Figure 4A:
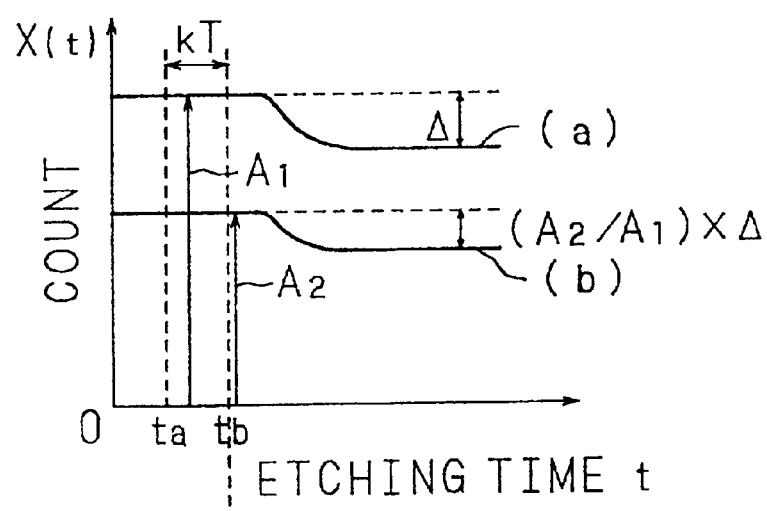
FIG. 4A shows waveforms for explaining the arithmetic operations for amplify signal waveforms.
Figure 4B:
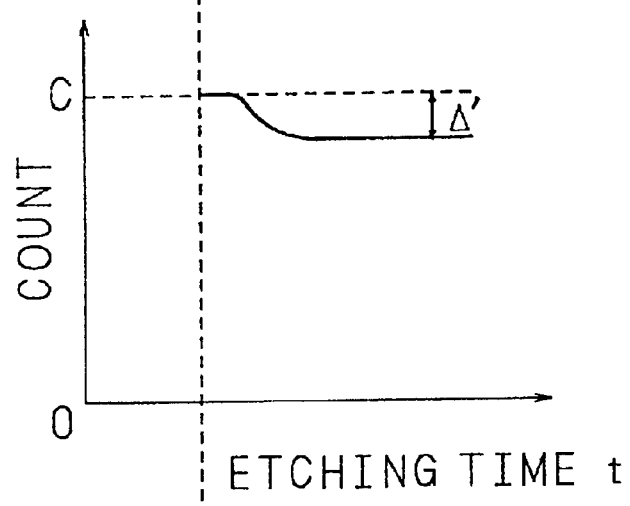
FIG. 4B shows waveforms for explaining the arithmetic operations for amplifying signal waveforms.
Figure 4C:
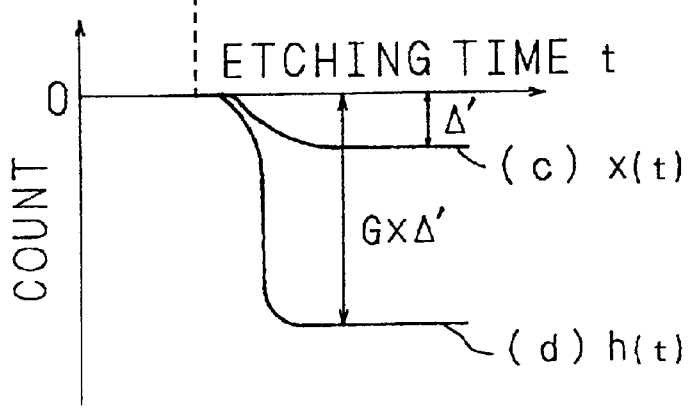
FIG. 4C shows waveforms for explaining the arithmetic operations for amplifying signal waveforms.

FIG. 3 is a flowchart showing the procedure of arithmetic operation according to example 1 for amplifying the time series data, FIGS. 4A to 4C are diagrams showing waveforms that shows the time series data for explaining the arithmetic operation. The abscissa in FIGS. 4A to 4C represents the etching time, and the ordinate the count of the amount of light obtained by the A/D converter 6. When the output signal of the photoelectric transducer 5 as A/D converted is directly plotted, a waveform (original waveform) attenuated with time as shown in FIG. 4A is obtained. The waveform (a) in FTC. 4A represents the etching process in which the count in the initial period of etching is large with a value $A_1$ and change rate is large due to a small amount of the deposited reaction products on the detection window 4. The waveform (b) in FIG. 4A, on the other hand, shows the etching process in which the count in the initial period of etching is small with a value $A_2$ and change rate is small due to a large amount of the deposited reaction products on the detection window 4 as compared with the waveform (a). Let the difference in count between the initial and final points of the etching process in waveform (a) be $\Delta$. The difference in count between the initial and final points for the waveform (b) is given as $(A_2/A_1) \times \Delta$. In other words, the ratio of count is the same in the starting time as in the ending time of the etching process.

FIG. 4B shows a waveform subjected to auto gain correction by conversion. In order to attain the auto gain correction, an appropriate period kT ($\times t_b - t_a$) when the amount of light is stable before attenuation is set (step S1). When data X(t) corresponding to the amount of light at an etching time point t is inputted (step S2), (FIG. 3) it is judged whether $t \geq t_a$ (step S3). When the result of judgment is "No", the process returns to the step S2. When the result as "Yes", it is judged whether $t \leq t_b$ (step S4). When the result of judgment is "Yes", the sampling data for the sampling period kT is averaged according to an equation (1) to obtain $V_{ave}$ (step S5). As seen from an equation (2), a constant C representing a maximum value in terms of software determined by the number of bits of the computer 7 (such a constant C is $2^{15} \times 32768$, for example, when a 16-bit computer is used) is divided by $V_{ave}$ of the equation (1) thereby to obtain a coefficient AGF (auto gain factor) (step S6), the process returns to the step S2. When the result of judgment in the step S4 is "No", the time series data is multiplied by the coefficient AGF and subtracted by the constant C for auto offset according to an equation (3) (step S7). The multiplication by the coefficient AGF converts the waveforms shown with (a) and (b) of FIG. 4A into a waveform with a count difference $\Delta'$ between initial and final points of etching, as shown in FIG. 4B.

When the data is multiplied by a factor of G according to an equation (4)(step S8), a waveform (c) shown in FIG. 4C obtained in the step S7 is expanded as shown with a waveform (d) of FIG. 4C. And then it is judged whether an etching endpoint has been reached from the data multiplied by the factor G (step S9). When an etching endpoint is detected, the process is finished. When it is nob detected, the process returns to the step S2.

In this way, the case with a large amount of the deposited reaction products is handled in similar fashion to the case involving a small amount of the deposited reaction products to obtain a amplified waveform.

(Example 2)

Figure 5:
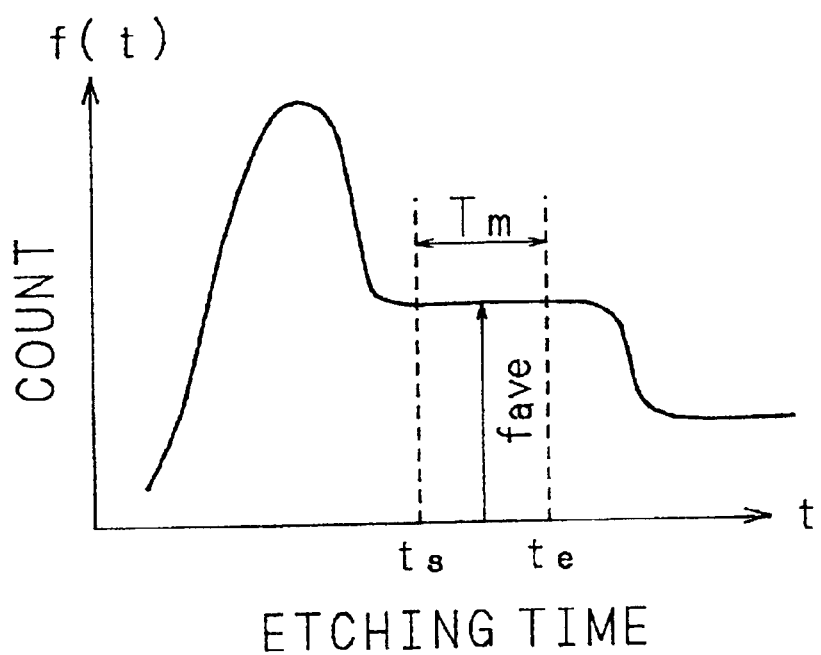
FIG. 5 is a diagram showing an original waveform.

In example 1 described above, in order to facilitate understanding, the amount of light generated during the etching process is shown as in FIG. 4A. The actual amount of light, however, decreases irregularly as shown in FIG. 5, because discharge is often unstable during the rise time of plasma. In order that an etching endpoint may not be erroneously detected, it is necessary to determine the intermediate period where the value is settled in the course of the etching process accurately. In detecting an etching endpoint, therefore, the starting time point and ending time point of a sampling period within the intermediate period are determined, a reference value for the sampling period is set, the time series data is corrected using the reference value, and an etching endpoint is determined from the time series data thus corrected.

Figure 6:
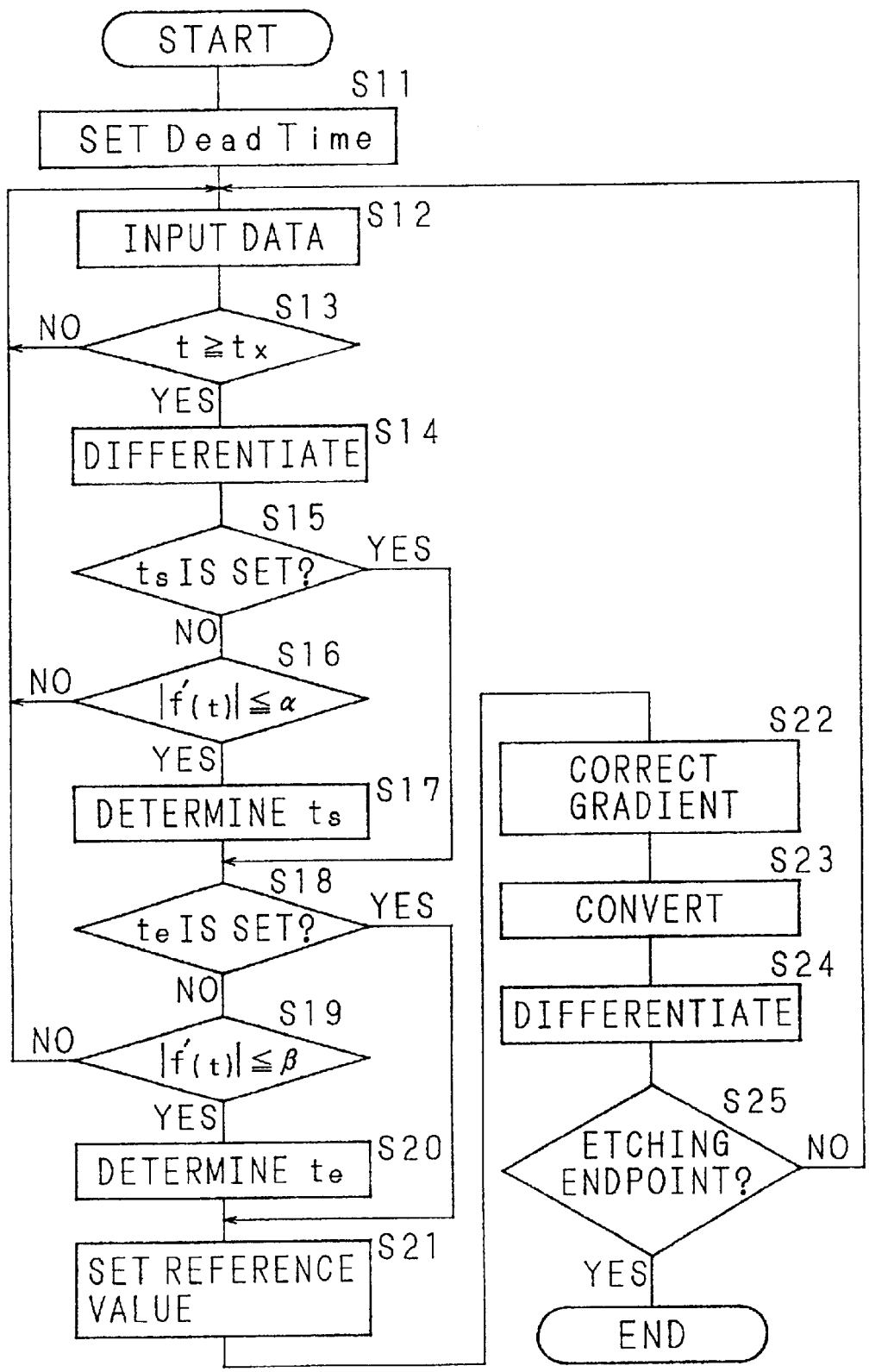
FIG. 6 is a flowchart showing the procedure of operation according to example 2.
Figure 7A:
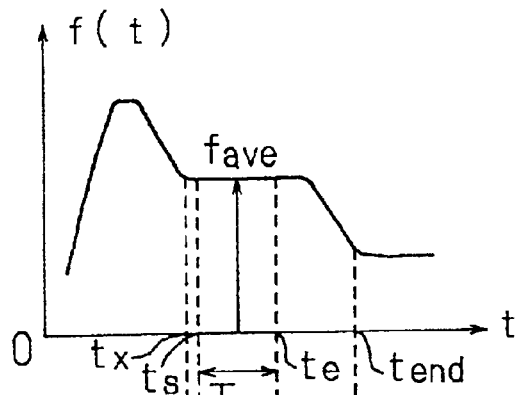
FIG. 7A shows waveforms for explaining the arithmetic operation for detecting an etching endpoint by setting a reference value.
Figure 7B:
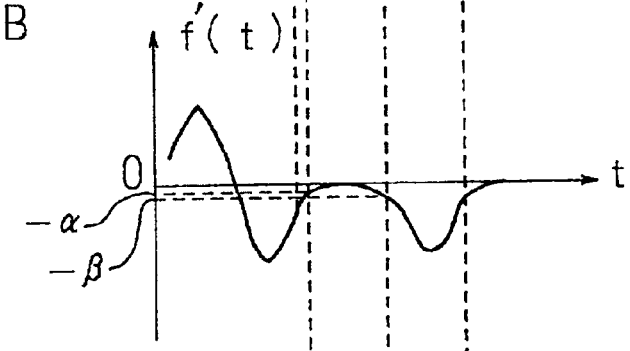
FIG. 7B shows waveforms for explaining the arithmetic operation for detecting an etching endpoint by setting a reference Value.

FIG. 6 is a flowchart showing the procedure of arithmetic operation according to example 2 for detecting an etching endpoint by setting a reference value. FIGS. 7A to 7D are diagrams showing waveforms for explaining the arithmetic operation, and represent the case of measuring the amount of the plasma light generated by the reaction products created by etching. First, a test run is conducted to determine a period (Dead Time: $0 \leq t < t_x$) when the discharge is unstable during the rise time of plasma is determined from the waveform (step S11). When data f(t) corresponding to the amount of light at a time point t is inputted (step S12), it is judged whether $t \geq t_x$ (step S13). When the result of judgment is "No", the process returns to the step S12. When the result is "Yes", the time series data is differentiated (step S14). When the starting tune point $t_s$ is not set in step S15, the time point when an equation (5) is first satisfied is assumed to be a starting time point $t_s$ of the sampling period $T_m$ (step S17). When a time point does not satisfy the equation (5), the process returns to the step S12. After that, when the ending time point is not set in a step S18, a subsequent time point satisfying an equation (6) is assumed to be a ending time point of the sampling period $T_m$ (step S20). When a time point does not satisfy the equation (6), the process returns to the step S12. FIG. 7A shows an original waveform (f(t)) similar to that shown in FIG. 5, and FIG. 7B a waveform (f'(t)) obtained by differentiating the waveform of FIG. 7A. $\alpha$ and $\beta$ are values predetermined according to the etching conditions for an object to be etched.

A reference value is taken from any of the average value, the maximum value and the minimum values f(t) for the sampling period $T_m$ ($t_s \leq t \leq t_e$) (step S21) after the starting time point $t_s$ and ending time point $t_e$ are set. According to the embodiment under consideration, the average $f_{ave}$ is used as a reference value. Next, the average gradient a in the sapling period $T_m$ is determined by an equation (7) or the least square method, and the data is corrected according to an equation (8) (step S22).

In the ease of FIGS. 7A to 7D, there are no fluctuations and the gradient in the intermediate period is zero. Correction by the equation (8), therefore, is not specially required. In the case where the intermediate period has a gradient as shown in FIG. 8A, however, the gradient can be reduced substantially to zero by this correction as shown in FIG. 8B.

Figure 7C:
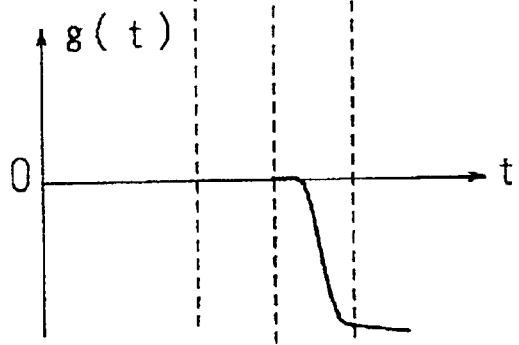
FIG. 7C shows waveforms for explaining the arithmetic operation for detecting an etching endpoint by setting a reference value.
Figure 8A:
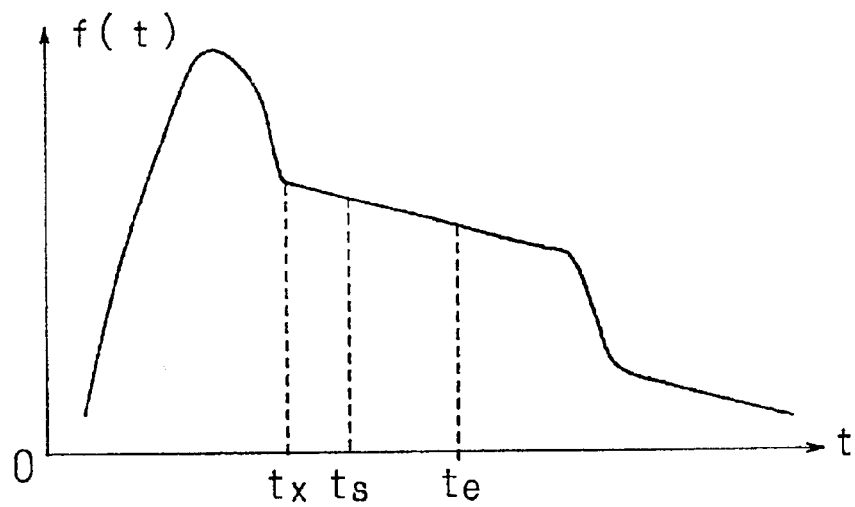
FIG. 8A shows waveforms for explaining tho arithmetic operation in a case where an intermediate period has a gradient.
Figure 8B:
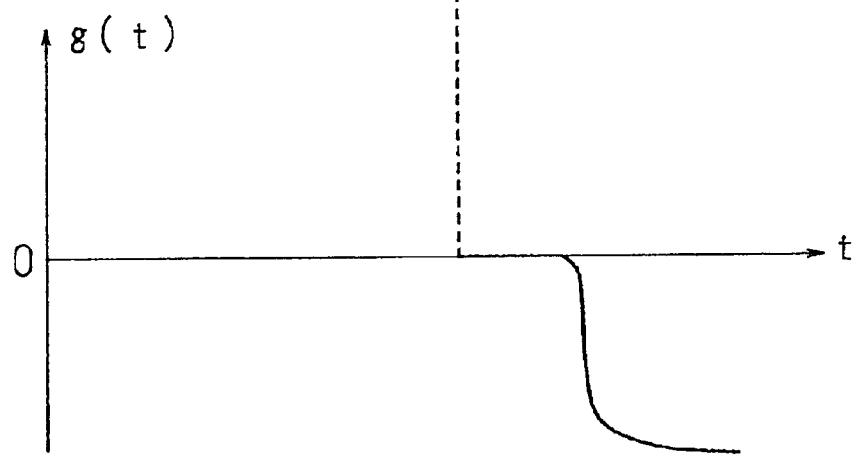
FIG. 8B shows waveforms for explaining the arithmetic operation in a case where an intermediate period has a gradient.
Figure 9A:
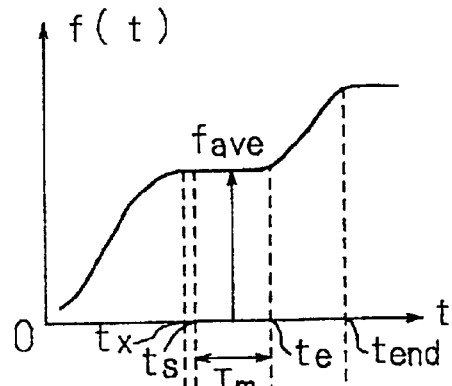
FIG. 9A shows waveforms for explaining the arithmetic operation for detecting an etching endpoint by setting a reference value.
Figure 9B:
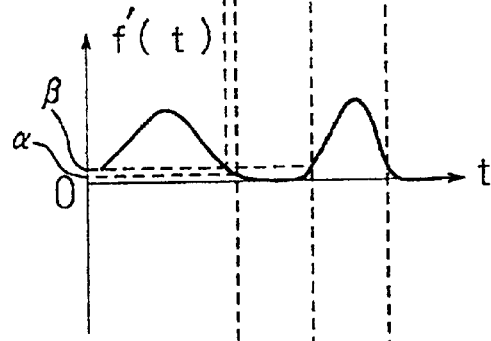
FIG. 9B shows waveforms for explaining the arithmetic operation for detecting an etching endpoint by setting a reference value.
Figure 9C:
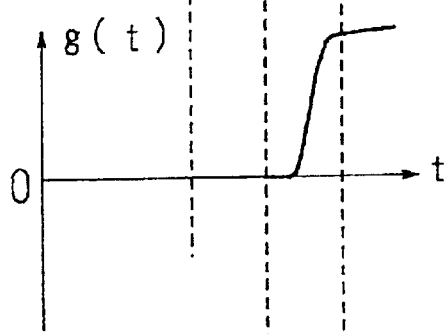
FIG. 9C shows waveforms for explaining the arithmetic operation for detecting an etching endpoint by setting a reference value.
Figure 9D:
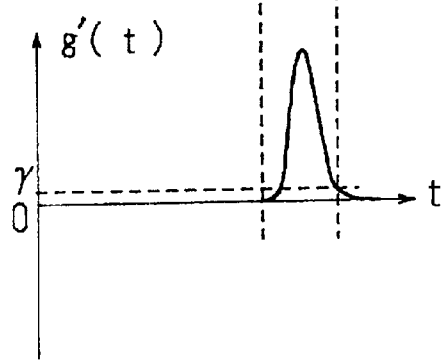
FIG. 9D shows waveforms for explaining the arithmetic operation for detecting an etching endpoint by setting a reference value.

When the data corrected in the gradient is converted according to equations (9) and (10) (step S23), a waveform (g(t)) shown in FIG. 7C. The equation (10) is obtained by substituting the equation (8) into the equation (9), where G and C assume a similar value to corresponding factors described above respectively.

Figure 7D:
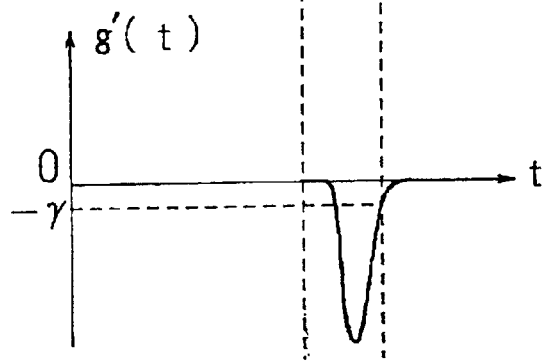
FIG. 7D shows waveforms for explaining the arithmetic operation for detecting an etching endpoint by setting a reference value.

The data thus obtained is differentiated to produce a waveform (g'(t)) as shown in FIG. 7D (step S24). The differentiated data is judged whether it is an etching endpoint (step S25). The etching endpoint $t_{end}$ is a time point satisfying an equation (12). after satisfying an equation (11). Another etching endpoint may be a time point when the equation (11) is first satisfied. The value $\gamma$ and the conditions for ending the etching process are predetermined according to the conditions for etching an object to be etched. When an etching endpoint is detected, the process is finished. When is not detected, the process returns to the step S12.

This embodiment deals with detecting an etching endpoint in the case where the plasma light is generated in such an amount as shown in FIGS. 7A to 7D by the reaction products formed during the etching process. As another example, however, detection with similar processing steps is possible also by using the amount of light due to an etchant as shown in FIGS. 9A to 9D. This can be realized by changing a set wavelength in order to change the wavelength of light taken into the photoelectric transducer 5. A particular wavelength of light used for the processing can be selected appropriately according to the conditions of an object to be etched, although it is preferable to select a wavelength with a large change in amount of light between the intermediate period and the etching endpoint. The starting time point $t_s$ and ending time point $t_e$ can be determined in the test run.

Now, another method for correctively converting time series data with a "large" amount of the deposited reaction products on the detection window 4 and time series data with a "small" amount of the deposited reaction products on the detection window 4 by a similar process will be described with reference to examples 3 to 7.

(Example 3)

Figure 10:
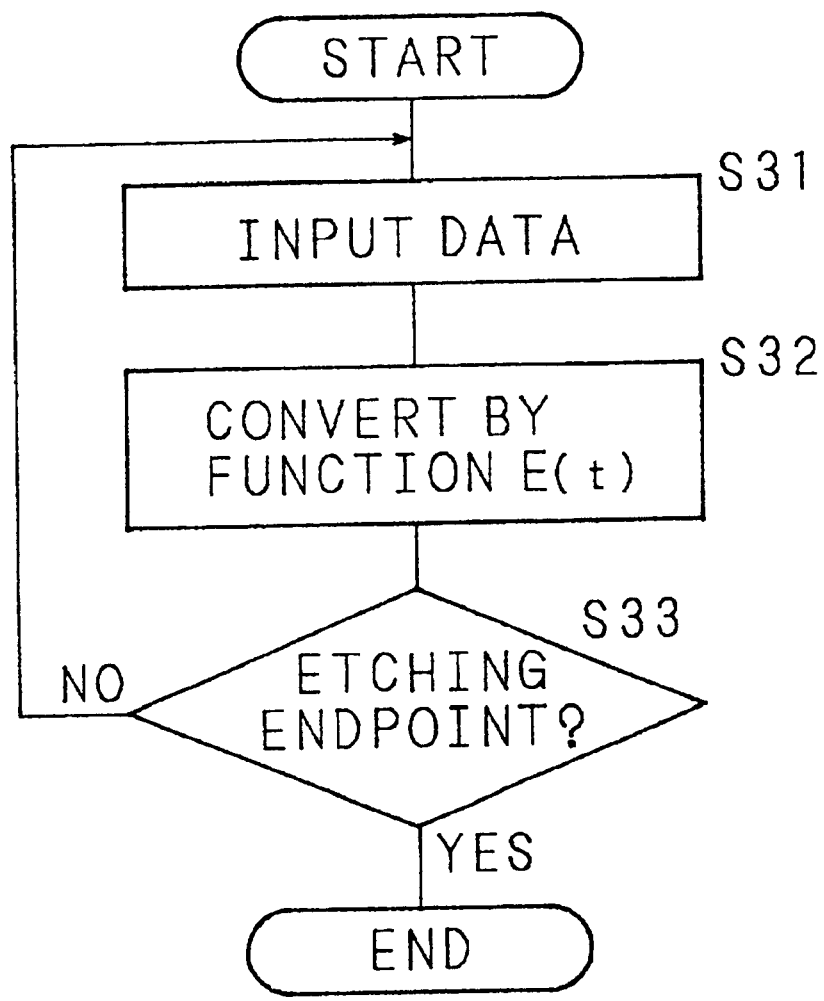
FIG. 10 is a flowchart showing the procedure of operation according to example 3.
Figure 11:
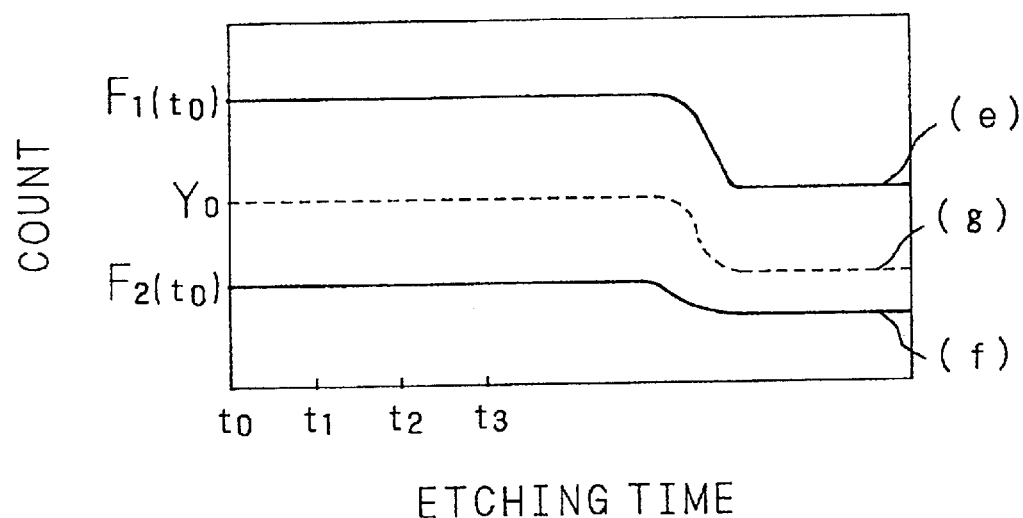
FIG. 11 is a diagram showing an original waveform and a converted waveform according to example 3.

FIG. 10 is a flowchart showing the procedure of operation according to example 3, and FIG. 11 a diagram showing an original waveform (solid line e) with a "small" amount of the deposited reaction products on the detection window 4, an original waveform (solid line f) with a "large" amount of the deposited reaction products, and a waveform (dashed line g) after conversion from the foregoing two waveforms. When time series data is inputted (step S31), the data is converted by a function E(t) as shown in an equation (13) in such a way as to hold the ratio between $F(t_{n-1})$ and $F(t_n)$ representing values one sampling period apart from each other (step S32). As the result, the converted waveform (g) is obtained. An etching endpoint is detected using this converted time series data (step S33). When it is not detected, the process returns to the step S31.

The waveform based on the function E(t) shown in the equation (13) has a similar shape to the waveform due to the function F(t). According to the equation (13), the $F_1(t)$ for a "small" amount of the deposited reaction products and $F_2(t)$ for a "large" amount of the deposited reaction products both assume a function E(t), with the result that the function E(t) is obtained for all the amounts of the deposited reaction products. An equation (14) is obtained by solving the equation (13).

$Y_0/F(t_0)$ is a constant, and therefore the equation (14) assumes a function obtained by multiplying F(t) by a factor of $Y_0/F(t_0)$ with an initial value $Y_0$. By setting the initial value $Y_0$ appropriately, time series data can he obtained in a desired range. As a result, the etching endpoint for all amounts of the deposited reaction products can be detected according to the same program.

(Example 4)

Although a waveform representing the amount of light in example 3 is given as shown in FIG. 10, and conversion is made from a sampling starting time $t=t_0$, discharge is often unstable during the rise time of plasma. In such a case, a Dead Time is required to be set in the manner described below.

Figure 12:
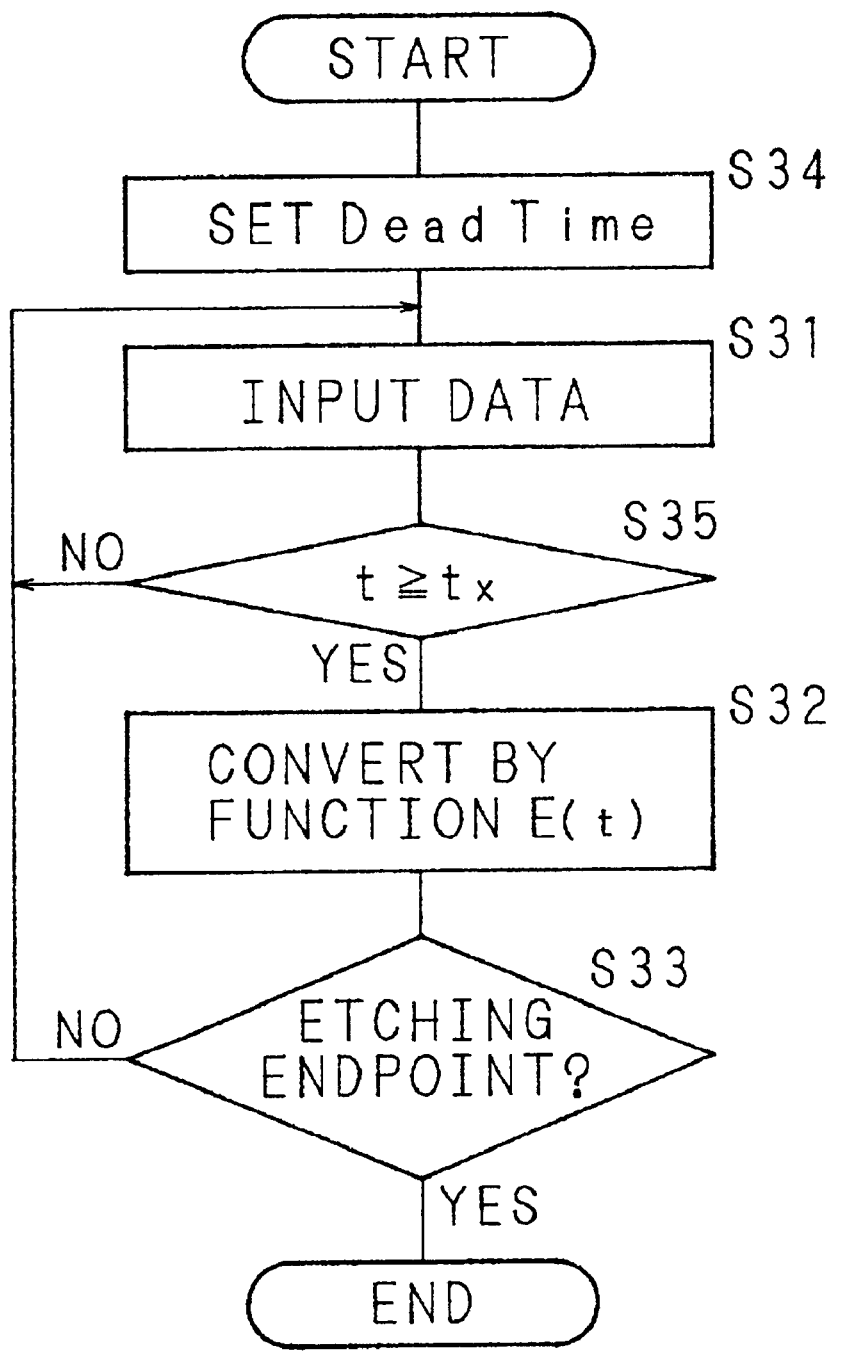
FIG. 12 is a flowchart showing the procedure of operation according to example 4.
Figure 13:
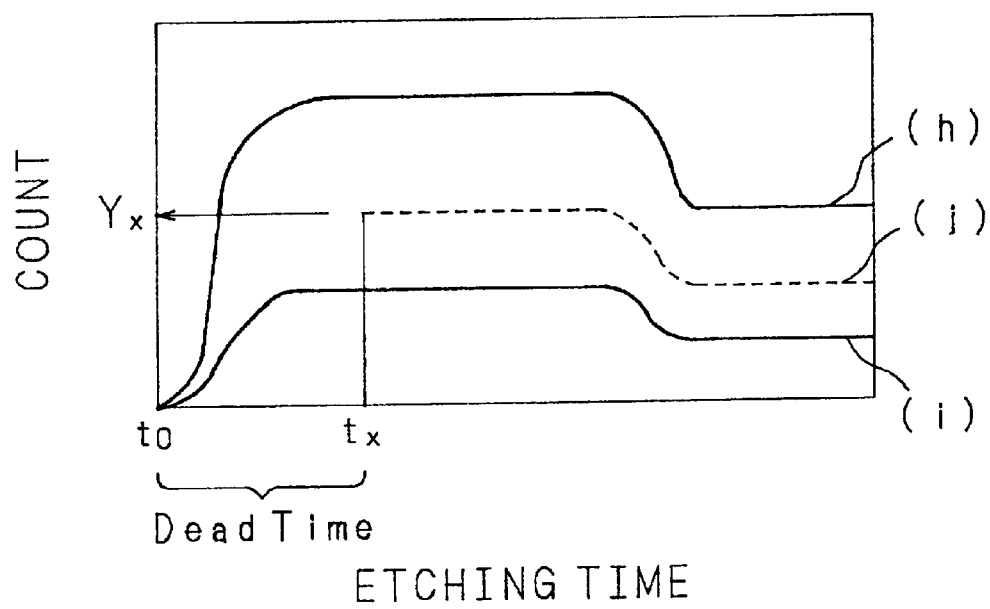
FIG. 13 is a diagram showing an original waveform and a converted waveform according to example 4.

FIG. 12 is a flowchart showing the procedure of operation according to example 4. FIG. 13 is a diagram showing a waveform (solid line h) with a "small" amount of the deposited reaction products on the detection window 4, a waveform (solid line i) with a "large" amount of the deposited reaction products, and a waveform (dashed line j) obtained by converting the foregoing two waveforms with a Dead Time. In the example 4, first, a test run is conducted to set Dead Time ($0 \leq t < t_x$) (step S34). When data is inputted (step S31), it is judged whether $t \geq t_x$ (step S35). When the result of judgment is "Yes", the process proceeds to the step S32. When the result is "No", the process returns to the step S31.

In this way, conversion of this example 4 is started from the time $t_x$, and a value $Y_x$ for $t=t_x$ is used as the initial value in place of the value $Y_0$ in the equations (13) and (14). This eliminates the use of Y=F(t) when discharge is unstable, thereby improving the reliability of the initial value in the equations (13) and (14).

(Example 5)

Figure 14:
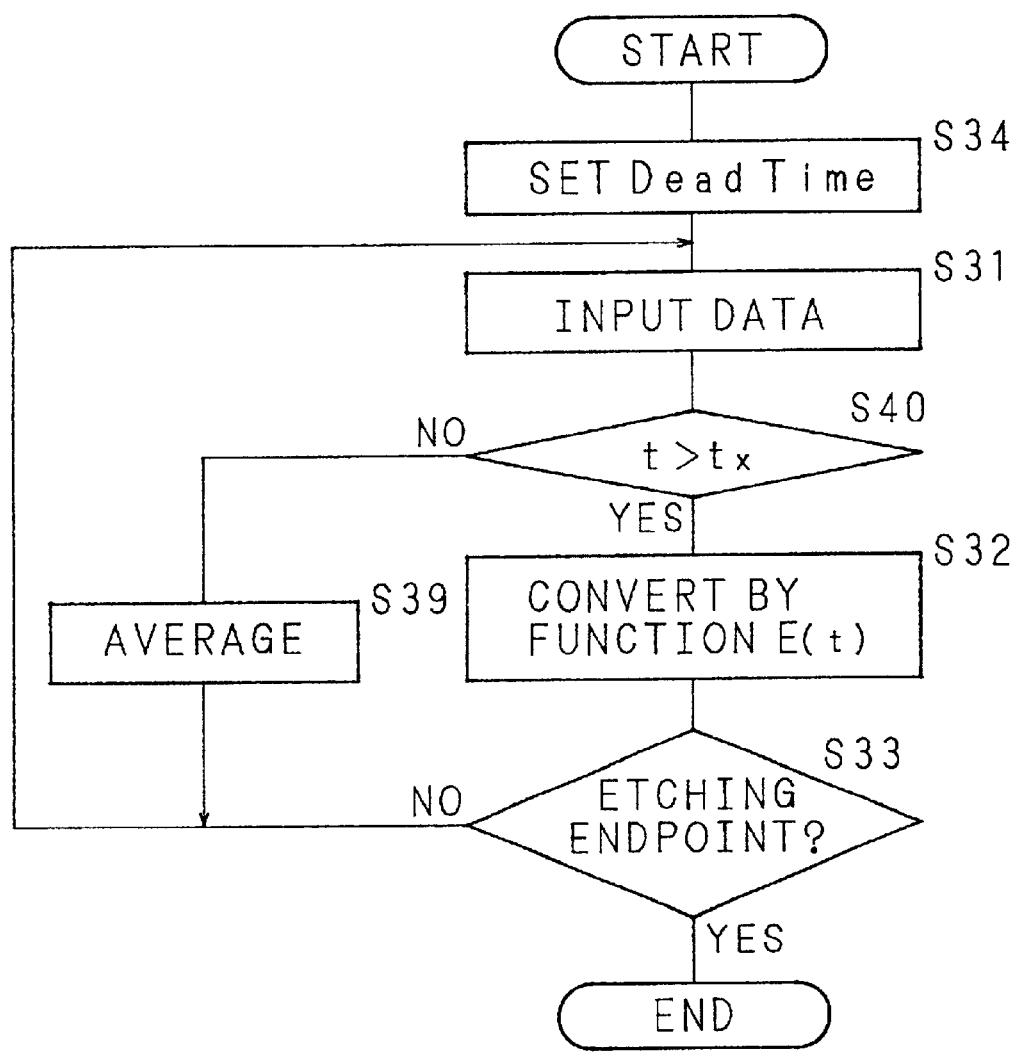
FIG. 14 is a flowchart showing the procedure of operation according to example 5.
Figure 15:
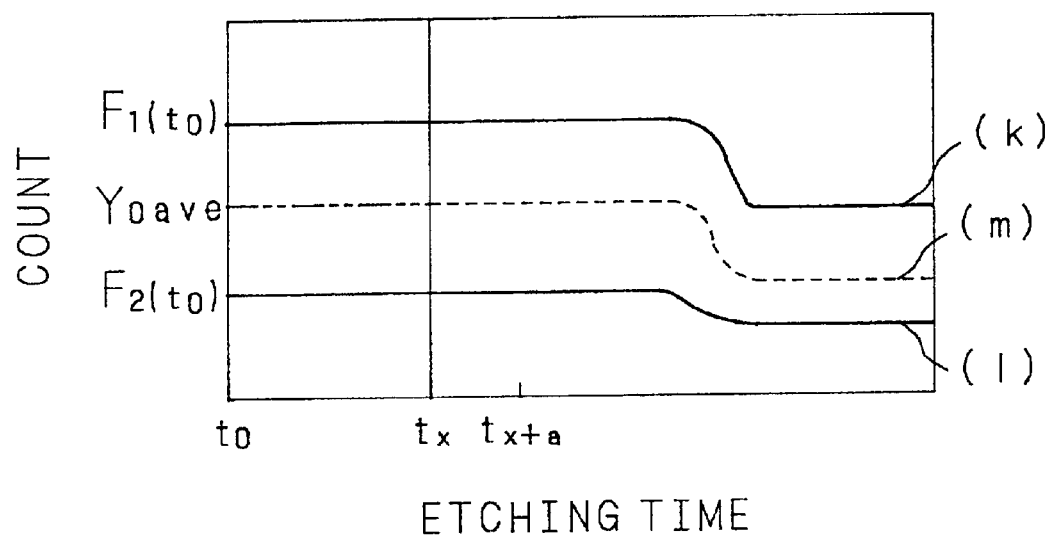
FIG. 15 is a diagram showing an original waveform and a converted waveform according to example 5.

FIG. 14 is a flowchart showing the procedure of operation according to example 5. FIG. 15 is a diagram showing a waveform (solid line k) with a "small" amount of the deposited reaction products on the detection window 4, a waveform (solid line l) with a "large" amount of the deposited reaction products, and a waveform (dashed line m) obtained by converting the foregoing two waveforms by use of the initial value $Y_{0ave}$ which is an average of Y=F(t) during the Dead Time. In example 5, after inputting data (step 31), when the result of judgment whether $t > t_x$ in the step S40 is "No", the data of Y=F(t) are averaged (step S36). And then the process returns to the step 531.

In example 5, the value $Y_{0ave}$ is obtained by averaging Y=F(t) for the duration of the Dead Time from $t=t_0$ to $t_x$ and used in place of $Y_0$ the equations (13) and (14). The formula for determining $Y_{0ave}$ is given as an equation (15). The reliability of the initial value thus is improved.

(Example 6)

Figure 16:
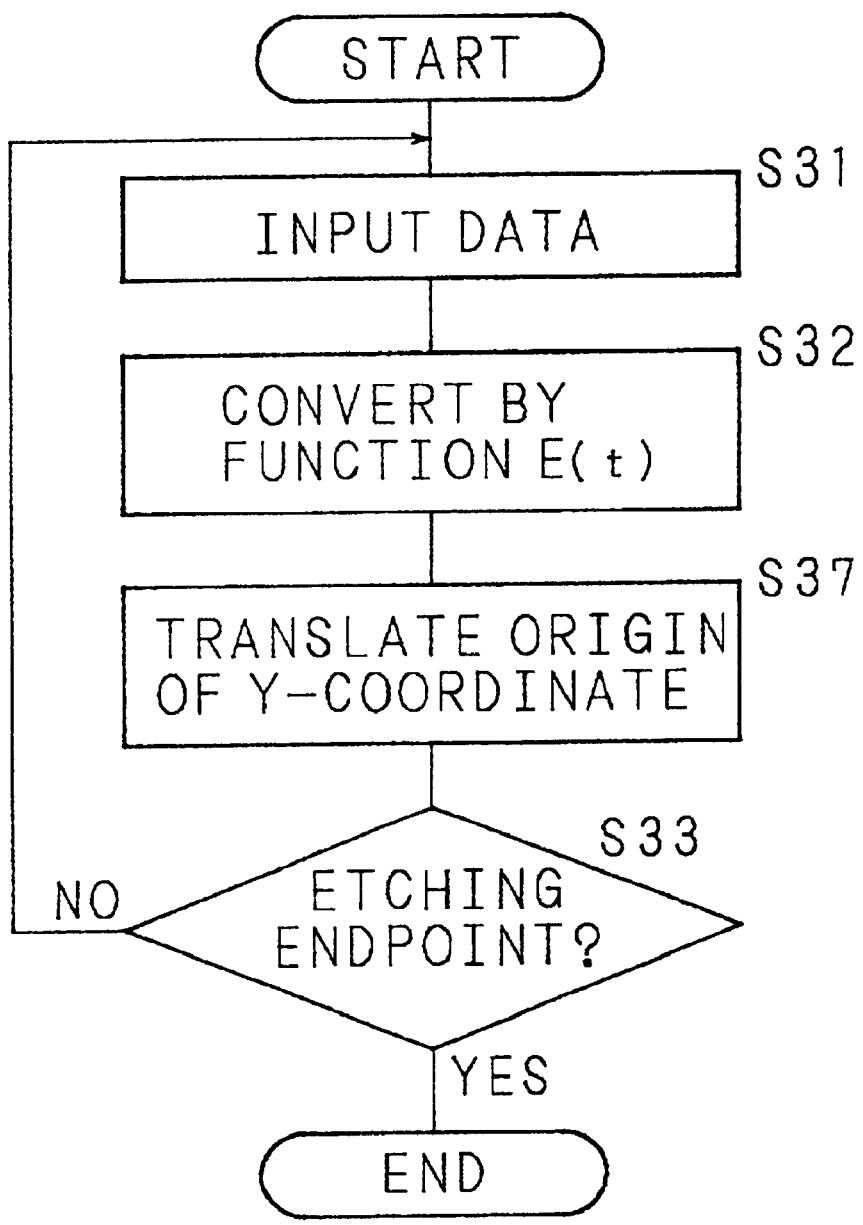
FIG. 16 is a flowchart showing the procedure of operation according to example 6.
Figure 17:
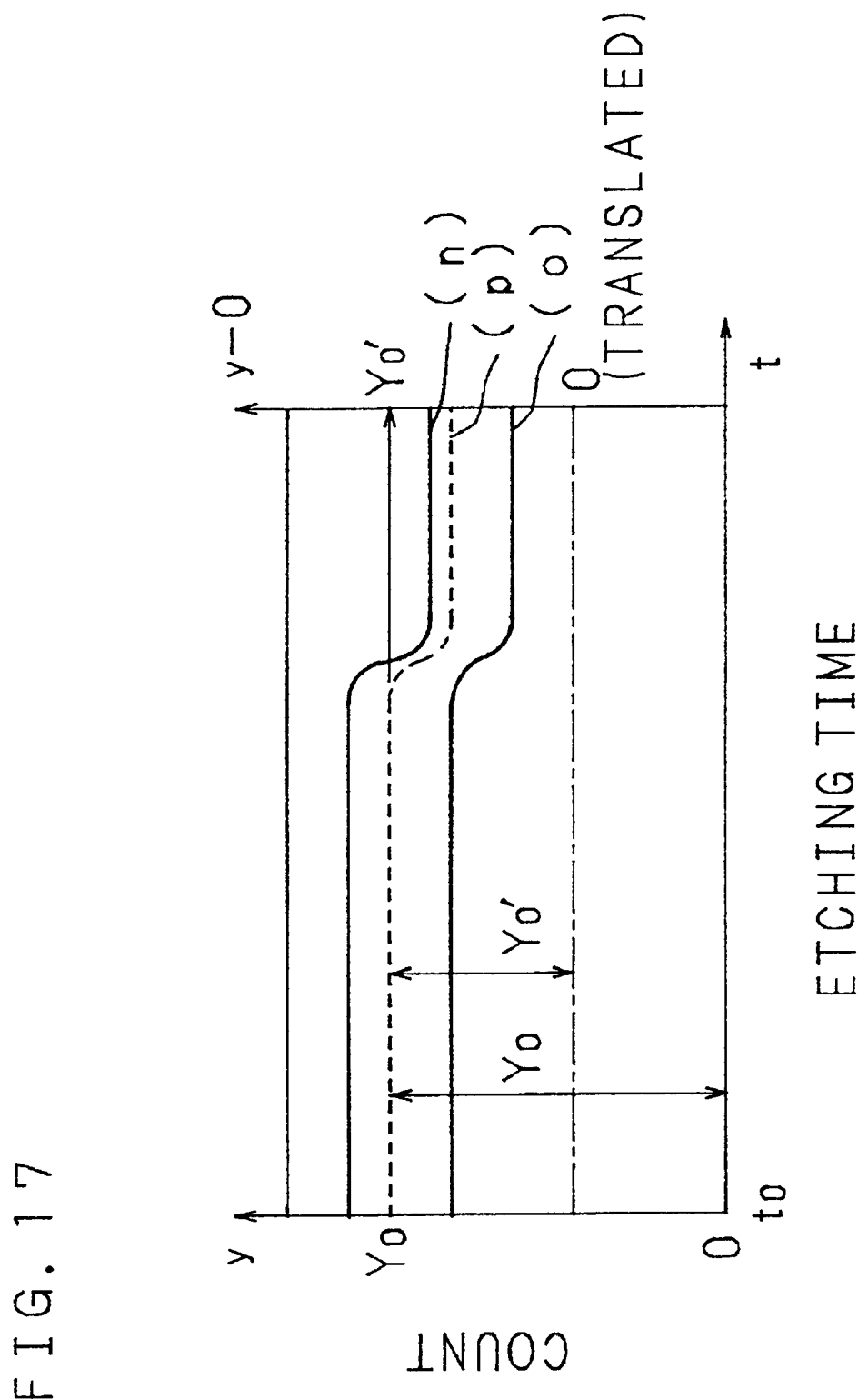
FIG. 17 is a diagram showing an original waveform and a converted waveform according to example 6.

FIG. 16 is a flowchart showing the procedure of operation according to example 6. FIG. 17 is a diagram showing a waveform (solid line n) with a "small" amount of the deposited reaction products on the detection window 4, a waveform (solid line o) with a "large" amount of the deposited reaction products and a waveform (dashed line p) obtained by translating the origin of the Y coordinate and converting the foregoing two waveforms. In example 6, the time series data after conversion by function E(t) is subtracted by a predetermined value to translate the origin of the Y coordinate by a predetermined amount in (+) direction (step S37). Consequently, the apparent change rate can be improved.

(Example 7)

Figure 18:
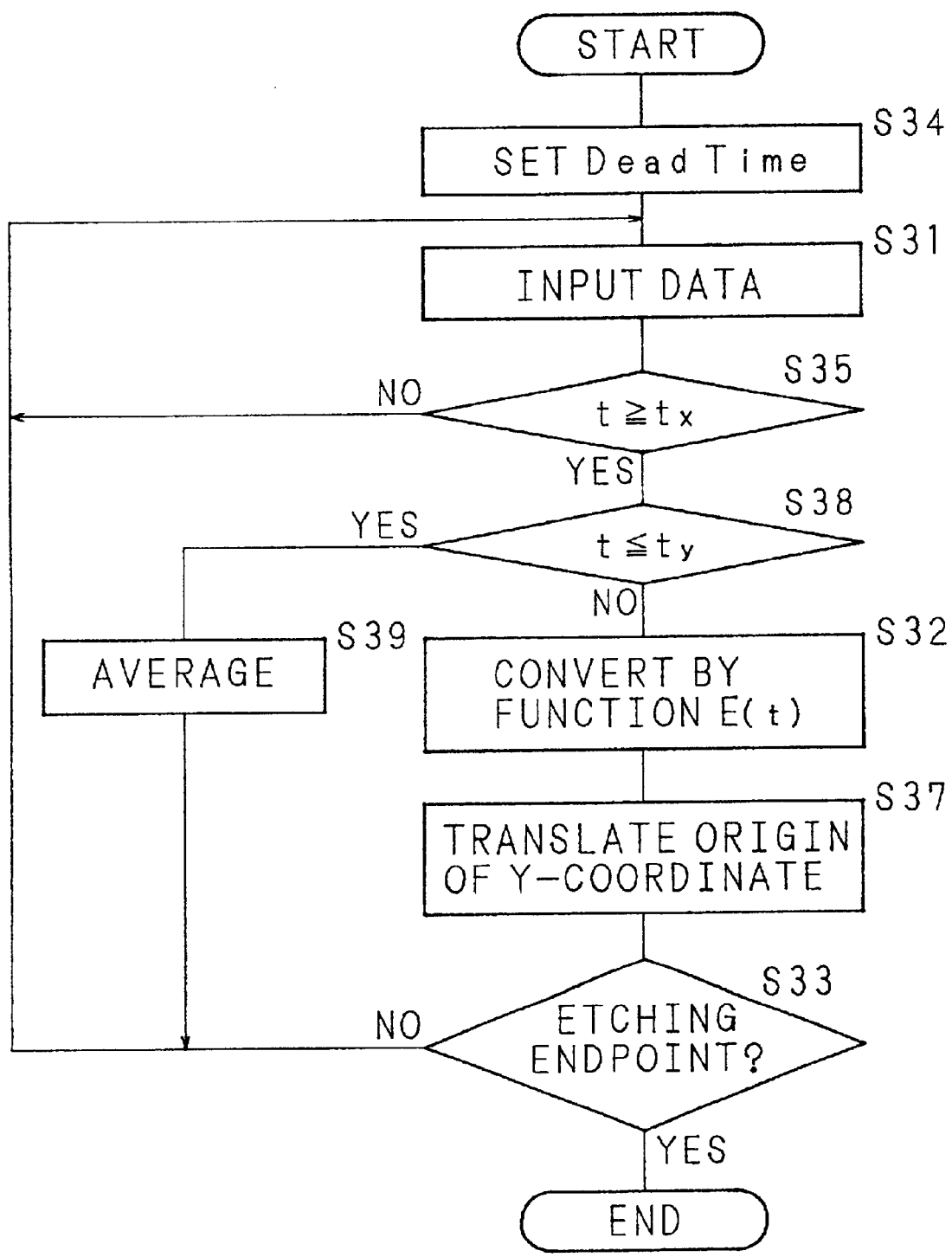
FIG. 18 is a flowchart showing the procedure of operation according to example 7.
Figure 19:
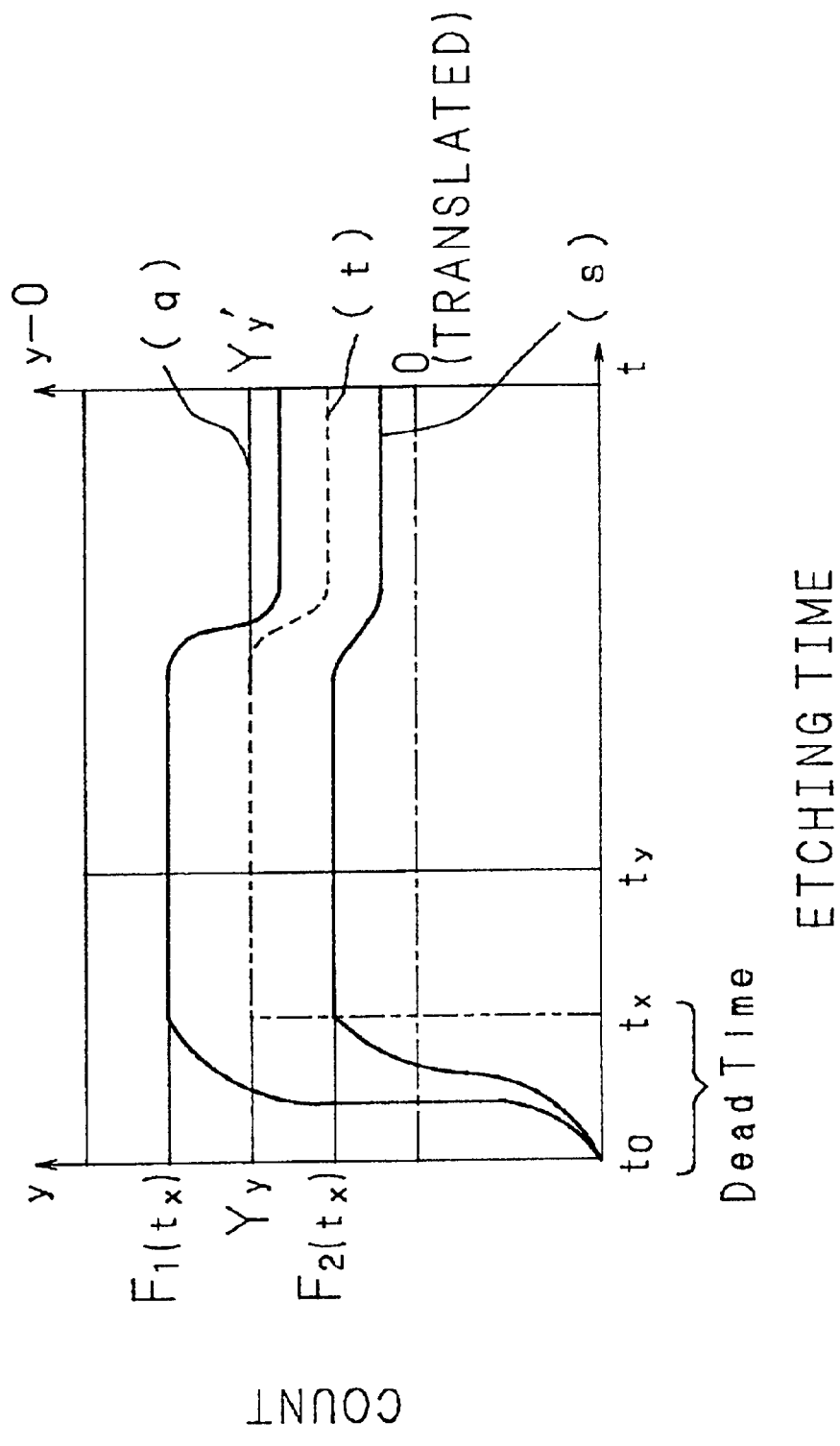
FIG. 19 is a diagram showing an original waveform and a converted waveform according to example 7.

FIG. 18 is a flowchart showing the procedure of operation according to example 7. FIG. 19 is a diagram showing a waveform (solid line q) with a "small" clouding degree of the detection window 4, a waveform (solid line s) with a "large" amount of the deposited reaction products and a waveform (dashed line t) obtained by converting the foregoing two waveforms using an average value $Y_y$ of Y=F(t) for a predetermined period of time after a Dead Time appropriately set and by translating the origin of the Y coordinate. Example 7 is approximately equal to a ease of integrating examples 3 to 6.

At first, a Dead Time is set (step S34), when the data is inputted (step S31), it is judged whether $t \geq t_x$ (step S35). When the result of judgment is "No", the process returns to the step S31. When the result is "Yes", it is judged whether $t \leq t_y$ (step S38). When the result is "Yes", the value $Y_y$ is obtained by averaging Y=F(t) for a predetermined period of time from $t=t_x$ to $t=t_y$ (step S39) and is used in place of in the equations (13) and (14). When the result in the step S38 is "No", after conversion according to function E(t) (step S32). the origin of the Y coordinate is moved by a predetermined length in (+) direction, so that the apparent waveform change rate is improved (step S37) and an etching endpoint is detected (step S33).

A formula for determining $Y_y$ is given as an equation (16). Consequently, time series data corresponding to all the clouding degrees can be converted automatically with a high reliability.

The method (step S33) for detecting an etching endpoint with using a converted time series data in the examples 3 to 7 is similar to the stops 24 and 25 in example 2, and therefore will not be described any more.

As described above, according to the invention, the original time series data corresponding to the amount of light is converted by a predetermined arithmetic operation, whereby an etching endpoint can be detected accurately using the same program without being affected by amount of the deposited reaction products, exposed area size, or fluctuations.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

$$V_{ave} = \frac{X(t_a) + \sum_{k=1}^{k} X(t_a + kT)}{k+1} \tag{1}$$

$$AGF = \frac{C}{V_{ave}} \tag{2}$$

$C$ : Constant $$x(t) = X(t) \cdot AGF - C \tag{3}$$
$$= X(t) \cdot \frac{C}{V_{ave}} - C$$

$T$ : sampling period
$X(t)$ : count of light amount at time point $t$ $$h(t) = G \cdot x(t) \tag{4}$$

$$|f'(t)| \leq \alpha \tag{5}$$

$$|f'(t)| \geq \beta \tag{6}$$

$$a = \frac{f(t_e) - f(t_s)}{t_e - t_s} \tag{7}$$

$$f_m(t) = f(t) - a \cdot (t - t_e) \tag{8}$$

$$g(t) = G \cdot C \left\{ \frac{f_m(t)}{f_{ave}} - 1 \right\} \tag{9}$$

$$g(t) = G \cdot C \left\{ \frac{f(t) - a \cdot (t - t_e)}{f_{ave}} - 1 \right\} \tag{10}$$

$$|g'(t)| \geq \gamma \tag{11}$$

$$|g'(t)| \leq \gamma \tag{12}$$

$$E(t_n) = \frac{F(t_n)}{F(t_{n-1})} E(t_{n-1}) \text{ where} \tag{13}$$
$$E(t_0) = Y_0$$
$$n \geq 1$$

-continued $$E(t_n) = \frac{F(t_n)}{F(t_{n-1})} E(t_{n-1}) \tag{14}$$
$$= \frac{F(t_n)}{F(t_{n-1})} \frac{F(t_{n-1})}{F(t_{n-2})} E(t_{n-2})$$
$$= \frac{F(t_n)}{F(t_{n-1})} \frac{F(t_{n-1})}{F(t_{n-2})} \frac{F(t_{n-2})}{F(t_{n-3})} E(t_{n-3})$$
$$\vdots$$
$$= \frac{F(t_n)}{F(t_0)} E(t_0)$$
$$= \frac{E(t_0)}{F(t_0)} F(t_n)$$

where $E(t_0) = Y_0$ $\therefore E(t_n) = \frac{Y_0}{F(t_0)} F(t_n)$ $$Y_{0ave} = \frac{1}{t_x} \left\{ \sum_{t=t_0}^{t_x} F(t) \right\} \tag{15}$$

$$Y_y = \frac{1}{t_y - t_x} \left\{ \sum_{t=t_x}^{t_y} F(t) \right\} \tag{16}$$

What is claimed is:

1. A system for detecting an etching endpoint on the basis of plasma light generated during the plasma etching process, comprising:
    means for receiving the plasma light into a photoelectrically transduced signal and photoelectrically transducing said plasma light;
    means for producing a time series data including a plurality of data values of the photoelectrically transduced signal;
    correcting means for digitally correcting the change of light amount due to change in the quality of the received plasma light of an arithmetic operation performed on said time series data; and
    means for detecting an etching endpoint from the corrected time series data.

2. An etching endpoint detecting system according to claim 1, further comprising:
    means for calculating an average value of an initial time series data for a predetermined period of time; and
    means for calculating a coefficient for corrective arithmetic operation using said average value,
    wherein said correction means corrects the time series data using said coefficient.

3. An etching endpoint detecting system according to claim 2, wherein said correction means offsets the initial value of the time series data to zero and multiplies the offset time series data by a predetermined value in addition to correcting the change of light amount.

4. An etching endpoint detecting system according to claim 2, wherein said correcting means sets a reference value for a predetermined period when the amount of light becomes stable during the etching process and corrects the time series data after the predetermined period using said reference value.

5. An etching endpoint detecting system according to claim 1, wherein said correction means corrects the time series data by a function holding the ratio between values apart from each other by a predetermined period of time.

* * * * *